United States Patent [19]

Monkowski et al.

[11] 4,415,545

[45] Nov. 15, 1983

[54] SOLID FILM GROWTH VIA PREFERENTIAL ETCHING OF LIQUID SOLUTIONS

[76] Inventors: Joseph R. Monkowski, R.D. #1, Box 141-A1, Bellefonte, Pa. 16823; Richard E. Tressler, R.D. #1, Julian, Pa. 16844

[21] Appl. No.: 216,198

[22] Filed: Dec. 15, 1980

[51] Int. Cl.$^3$ .................... C01B 33/02; C01B 19/00; C01B 25/08; C01G 30/00
[52] U.S. Cl. .................... 423/348; 156/624; 423/87; 423/299; 423/508; 423/509
[58] Field of Search .................... 423/348, DIG. 12; 23/295 R, 294; 75/63, 135; 156/624; 159/16 R, 13 C

[56] References Cited

U.S. PATENT DOCUMENTS

| | | | |
|---|---|---|---|
| 2,032,785 | 3/1936 | Zorn et al. ............. | 159/16 R X |
| 3,597,171 | 8/1971 | Knippenberg et al. ....... | 23/294 |
| 4,242,175 | 12/1980 | Zumbrunnen ............ | 266/217 |
| 4,288,411 | 9/1981 | Holland et al. ........... | 423/135 |

FOREIGN PATENT DOCUMENTS 907855  10/1962  United Kingdom ............ 423/348

Primary Examiner—O. R. Vertiz
Assistant Examiner—Steven Capella
Attorney, Agent, or Firm—Michael L. Dunn

[57] ABSTRACT

A process for growing crystals of an inorganic material by forming a solution of the material in a solvent for the compound, forming a film of the solution and etching the solvent from the film with an etching gas until crystals of the material form. The solution has a solidification temperature lower than the melting or sublimation temperature of the material and higher than the condensation temperatures of the etching gas and of reaction products formed by the etching. The etching temperature is between the solidification temperature of the solution and the melting or sublimation temperature of the material and is lower than the vaporization temperature of the solvent and solution and higher than the condensation temperatures of the etching gas and reaction products.

44 Claims, No Drawings

SOLID FILM GROWTH VIA PREFERENTIAL ETCHING OF LIQUID SOLUTIONS

BACKGROUND OF THE INVENTION (A) Field of the Invention

This invention relates to the formation of inorganic crystals and more particularly relates to a process for forming such crystals from a solution of a crystallizable inorganic material and a liquid solvent for the material.

(B) History of the Prior Art

In the prior art, inorganic crystals were formed or grown by several methods. One of the methods is by sublimation or vaporization of the compound or a precursor of the material to be crystallized followed by condensation of the vapor of the material at a temperature below the solidification temperature of the material. Such methods usually do not result in the formation of large crystals of the material but rather, due to the rapid crystal formation, generally result in crystals of very small particle size, e.g., on the order of a few microns. Furthermore, such a method and needed equipment for forming pure crystals of any substantial size, e.g., having a breadth of over about 500 microns, such as might be suitable for electronic applications, if possible at all, would be complex and costly. Such a vapor deposition method for forming silicon crystals smaller than desirable, e.g., a maximum dimension of about 100 microns, upon graphite or tin from gaseous silane vapor (silicon precursor) optionally with HCl, is described in an article by Graef et al in the Journal of Applied Physics, Vol. 48, No 9, September, 1977. A somewhat similar process using a silicon halide precursor is described in European Pat. Nos. 0-001-942 and 0-001-943.

Another method for forming crystals of inorganic materials is by fusion or melting of the inorganic material followed by very slowly cooling to form crystals. Such methods can result in crystals of large size, but due to the exceedingly long cooling periods to obtain large crystals, such procedures are avoided when more rapid methods are available.

A third method for the formation of crystals is by dissolving the inorganic material in a solvent for the material followed by either cooling the solution to decrease material solubility until crystals precipitate as a result of solution saturation at the lower temperatures or by vaporization of the solvent until crystals form due to saturation of the remaining solvent by the material, or both. Formation of crystals from solution often have well known disadvantages. In particular, crystal formation, especially for large crystals, is often not as fast as desirable and crystal size, while sometimes fairly large, is for certain materials often not as large as desirable, and such solutions are often subject to supersaturation which retards crystal growth thus necessitating inclusion of crystal seeds to act as nuclei in the formation of the crystals.

The above disadvantages of prior art processes for growing crystals are particularly apparent in the electronics area where large crystals of high purity are desired.

BRIEF DESCRIPTION OF THE INVENTION

In accordance with the invention, there is provided a new process for growing crystals of a crystallizable inorganic material. The new process comprises forming the solution of the compound in a liquid solvent for the material, forming a film of the solution and etching the solvent from the film with an etching gas which reacts with the solution to preferentially etch the solvent from the solution until crystals of the material form. The solution at the etching temperature and pressure must have a solidification temperature lower than the melting or sublimation temperature of the material and higher than the condensation temperature of the etching gas and higher than the condensation temperature of the reaction products formed by the etching. The etching temperature is between the solidification temperature of the solution and the melting or sublimation temperature of the material and is lower than the vaporization temperatures of the solvent and solution and higher than the condensation temperatures of the etching gas and reaction products.

The process of the invention is particularly advantageous since crystals of relatively large size can be very rapidly grown to the point of visually observing their growth.

The resulting crystals can often be of large size, often up to 3 to 4 millimeters in breadth or larger, and up to 100 microns in thickness or larger. It is believed that crystal sizes having thicknesses of over $\frac{1}{2}$ millimeter and breadths in excess of $\frac{1}{2}$ centimeter can be obtained.

DETAILED DESCRIPTION OF THE INVENTION

The crystallizable inorganic material, which is crystallized in accordance with the process of the invention, is essentially any inorganic material which can be crystallized from solution over extended periods of time or with small crystal sizes in accordance with traditional prior art methods. "Material", as used herein, includes both chemical combinations of elements and uncombined elements. "Inorganic", as used herein, includes ionic carbonates and generally excludes other carbon compounds.

The crystals, formed in accordance with the process of the invention, are in general essentially pure; that is, a crystal purity is usually defined by the solid solution limit of the solvent in the material. Such purity almost always exceeds 99%. The crystals formed, in the case of silicon, usually have a thickness of from about 10 to about 500 microns and usually have a maximum breadth dimension of from about $\frac{1}{2}$ to about 5 millimeters (500 to 5000 microns). The breadth dimensions are those dimensions perpendicular to the thickness of the crystal. Such large crystal dimensions were not easily obtainable in the prior art using solution crystallization methods. Specific examples of crystallizable materials for use in accordance with the present invention are silicon, gallium arsenide, indium phosphide, cadmium telluride and mercury cadmium telluride. If desired, a plurality of materials may be crystallized simultaneously to form integral or independent crystal matrices. This is especially useful when the matrix is to include a doping compound. A combination of such materials may be used in the process of the invention.

The solvent for use in accordance with the process of the present invention is selected based upon its characteristics relative to the material being crystallized. The solvent must be a solvent for the material and must form a solution having a solidification temperature below the melting or sublimation temperature of the material under the process conditions. Such process conditions include pressure conditions. In addition, the solvent must be capable of preferentially reacting with a selected gas, to etch the solvent from the solution and to form reaction products with the selected gas to form reaction products which are gaseous below the vaporization temperature of either the solvent or the material and below the melting or sublimation temperature of the material. The solution is formed at a temperature above the liquefication or melting temperature of the solution and below the vaporization temperature of the material.

Examples of specific solvents which may be used depending upon their solution capability for the material selected are aluminum, calcium, germanium, silver, antimony, copper, maganese, mercury, tellurium and magnesium.

The etching gas is a gas which reacts with the solution to preferentially etch the solvent from the solution until crystals of the material form. Furthermore, both the etching gas and the reaction products formed by the etching must have a condensation temperature lower than the etching temperature. The etching gas may be any gas which meets the above described conditions but is usually a halogen or a hydrogen halide especially $F_2$, $Cl_2$, $Br_2$, $I_2$, HF, HCl, and HBr. As previously discussed, the etching gas is selected so that the etching gas and the reaction products of the reaction of the gas with the solvent in the solution or perhaps with some of the material in the solution are gaseous at a temperature lower than the solidification temperature of the solution. The etching gas is further selected to etch the solvent preferentially over the material. The selection of the etching gas therefore depends upon the nature of the material, solvent and resulting solution and may also depend upon the etching conditions, in particular, the temperature and pressure.

"Preferentially etch", as used herein, means that the etching gas will etch the solvent under the etching conditions at a rate substantially faster than the rate at which the material is etched by the etching gas. In general, unless the solvent is etched by etching gas at a rate at least twice that the rate the material is etched by the gas, the gas would be unsuitable for use in accordance with the present invention. Desirably, etching gas should etch the solvent at a rate much faster than twice that the rate that the material is etched by the gas. It is desirable that the relative etching rate of the solvent being etched to the rate that the material is etched is as high as possible. Most desirably, the etching gas does not react with the compound at all.

At the etching temperature undissolved material must be solid, a saturated solution of the material, in the selected solvent must be liquid, and the etching gas and reaction products of the etching gas must be in gaseous form. To meet these requirements, as previously mentioned, the etching temperature must be above the solidification temperature of the solution and between that solidification temperature and the melting or sublimation temperature of the material. The etching temperature must also be lower than the vaporization temperature of the solvent and solution and higher than the condensation temperature of the etching gas and reaction products formed by reaction of the etching gas with the solution. The desired etching temperature can sometimes be varied by altering the relative vapor pressures of the solution, material, etching gas and reaction product by changing the reaction pressure.

Etching continues until an entirely crystalline surface is formed. Such crystal growth usually takes from about 1 to about 60 minutes and often from about 1 to about 5 minutes.

Prior to etching, a film of the solution is formed on any desired substrate. The substrate may be an electrically conductive substrate such as graphite or a metalized surface or may be non-conductive in the form a ceramic or glass. The film is formed in any desired manner but is usally formed by simply pouring the solution onto the surface. Other methods include dipping or spraying or forming the solution from the components in situ on the surface.

Silicon is one of the more important crystallizable inorganic materials suitable for use in accordance with the process of the invention. When silicon is used as the material, various solvents can be selected including aluminum, calcium, germanium, silver, antimony, copper, manganese and magnesium.

In all silicon systems, the solution, at least at atmospheric pressure, must be formed at a temperature below 2600° C. since that is the boiling point of silicon. Unless otherwise indicated, in discussions of specific systems, atmospheric pressure is assumed. Most such solutions are formed at a temperature below 1,420° C. since that is the melting point of silicon. Above the silicon melting point, crystals of silicon will not form; therefore, solutions formed above 1,420° C. must be cooled before etching. As a practical matter, such solutions are usually formed at a temperature below 1,350° C. and most preferably below about 1,200° C.

In a system wherein aluminum is the solvent for silicon, solution may formed at a temperature between about 580° C. and about 1,350° C. Although aluminum does not melt until about 659° C., the solution can actually be formed at a lower temperature than the melting temperature of aluminum since a eutectic forms between the aluminum and silicon which is liquid at about 580° C.

In silicon systems, the etching temperature is desirably not above about 1,200° C. but may be as high as 1,350° C. and theoretically as high as 1,410° C. In the case where aluminum is the solvent, HCl, HBr, $Cl_2$ and $Br_2$ can be used as etching gases since aluminum is preferentially etched by these gases between 580° C. and about 1,350° C. Both aluminum chloride and aluminum bromide are gaseous at the etching temperature. When HCl or HBr is used, the reaction product hydrogen also is gaseous. To the small extent that silicon is etched by the halogens or acids above described, the silicon chloride and silicon bromide reaction products are also gaseous at the etching temperature of between 580° C. and about 1,350° C.

Calcium can also be used as the solvent for silicon in accordance with the process of the invention; however, since calcium and silicon form an elevated melting point eutectic at about 980° C., the solution can not be formed at temperatures below about 980° C. and desirably the solution is formed and etching occurs at a temperature between about 985° C. and about 1,200° C. Temperatures in excess of about 1,200° C. can not be used since calcium boils at 1,240° C. The most suitable etching gases are HBr and $Br_2$ since calcium bromide is gaseous at the etching temperature.

Germanium may also be used as a solvent for silicon and in such cases, the solution is formed and the etching occurs between 940° C. and about 1,350° C. When germanium is used as the solvent, suitable etching gases are HF, HCl, HBr, $F_2$, $Cl_2$ and $Br_2$ since germanium is preferentially etched by these gases and the germanium halide reaction products are gaseous at the etching temperature. Furthermore, to the small extent that silicon halides form, such silicon halides are also gaseous at the etching temperature. When hydrogen halides are used, the hydrogen by product is also, or course, gaseous at the etching temperature.

Silver may also be used as a solvent for silicon and in such cases the solution is usually formed and the etching occurs at a temperature of between about 835° C. and about 1,350° C. The temperature of 835° C. can be used which is substantially lower than the melting temperature of silver which is about 961° C. due to the formation of a depressed melting point eutectic between silver and silicon. Suitable etching gases are HF and $F_2$ at an etching temperature of between about 1,160° C. to about 1,350° C. A minimum etching temperature of about 1,160° C. must be used since that is the vaporization temperature of silver fluoride reaction product.

Antimony may also be used as a solvent for silicon. When antimony is used, the solution is usually formed at a temperature between about 631° C. and about 1,200° C. A minimum temperature of 631° C. is used since antimony melts at about that temperature to form the liquid solvent and a maximum temperature at about 1,200° C. is used since antimony boils at 1,380° C. and the boiling point of the solvent should desirably not be approached. For the same reasons, etching occurs between these temperatures. Suitable etching gases are $Cl_2$ and HCl since antimony chloride is gaseous between 631° C. and about 1,200° C.

Copper may also be used as a solvent for silicon. When copper is used, the solution is usually formed and etching occurs between about 1,085° C. and about 1,350° C. Suitable etching gases are HF and $F_2$ since the reaction product copper fluoride is gaseous at the etching temperature.

Manganese may also be used as a solvent for silicon and the solution is usually formed at a temperature of between 1,150° C. and 1,350° C. and etching occurs between 1,190° C. and 1,350° C. since the reaction products are gaseous within that range.

Materials other than silicon can be used. For example, gallium arsenide may be used as the material wherein the solvent is gallium and solution is usually formed at a temperature between 30° C. and about 1,200° C. The low temperature of 30° C. can be used since gallium melts at about 29.8° C. A maximum temperature of about 1,200° C. is used since gallium arsenide melts at slightly over 1,200° C. Suitable etching gases are fluorine, chlorine and bromine. When chlorine is used, the etching temperature is between 202° C. and about 1,200° C. since the reaction product gallium chloride is a gas in that temperature range. When bromine is used, the etching temperature is between 279° C. and 1,200° C. since gallium bromide is gaseous at a temperature above about 279° C. When fluorine is used, the etching temperature is between about 800° C. and 1,200° C. and preferably between about 1,000° C. and 1,200° C. since gallium fluoride is a gas within these temperature ranges. Iodine may also be used as an etching gas in a gallium arsenide compound-gallium solvent system. When iodine is used as the etching gas, the etching temperature is between 345° C. and 1,200° C. since gallium iodide is gaseous above 345° C.

Indium phosphide may also be used as the material and the solvent may be indium. In such cases, the solution is usually formed at a temperature between 157° C. and 1,050° C. Chlorine, bromine or iodine may be used as the etching gas. When chlorine is used, the etching temperature is between 608° C. and 1,050° C., when bromine is used, the etching temperature is between 662° C. and 1,050° C. and when iodine is used, the etching temperature is between 715° C. and 1,050° C.

Cadium telluride may be used as the material wherein the solvent is tellurium. In this system, the solution is usually formed between 452° C. and 1,000° C. The etching gas may be chlorine or bromine. When chlorine is used, the etching temperature is between 452° C. and 1,000° C. and when bromine is used, the etching temperature is between 452° C. and 1,000° C.

Mercury cadmium telluride may be the material and the solvent may be either mercury or tellurium. When mercury is used as the solvent, the solution is usually formed between −38° C. and +1,000° C. The etching gases may be either bromine or chlorine. When bromine is used, the etching temperature is between 345° C. and 1,000° C. and when chlorine is used, the etching temperature is between 315° C. and 1,000° C. When tellurium is used as the solvent, the solution is usually formed and etching occurs between 452° C. and 1,000° C. The etching gas may be chlorine since tellurium chloride is gaseous at the etching temperature.

Etching may also occur at pressures less than one atmosphere which alters the temperatures at which the etching gas and reaction products will be in vapor form. A particularly desirable system which may be used at reduced pressure, is the system wherein the material is silicon and the solvent is magnesium. The solution is usually formed at a temperature of from about 950° C. to 1,100° C. A suitable etching gas is HCl when the etching temperature is between about 1,000° C. and 1,100° C. and the etching pressure is between about 0 and about 220 grams per square centimeter absolute.

EXAMPLE

This example serves to illustrate and not limit the present invention. A layer of aluminum on a graphite surface substrate having dimensions of 2×2.5 centimeters is formed by vaporizing aluminum onto the surface to form a layer having a thickness of about 10 microns. The aluminum coated substrate was then placed into a chemical vapor deposition reactor and heated to 1,200° C. A mixture of $SiH_4$ and $H_2$ was then passed over the molten aluminum to form a solution of silicon in aluminum. When the solution was saturated with silicon, which could be ascertained by the presence of a few small nuclei, the $SiH_4$ flow was terminated. The HCl etching gas was then added to the $H_2$. After the gas was added, one could actually see the grains of silicon crystals growing and after a few minutes, the graphite surface was coated with a polycrystalline silicon film possessing silicon grains of several millimeters in diameter. At the etching temperature of about 1,200° C., the solution of silicon in aluminum is liquid, silicon is solid and the HCl etching gas, hydrogen carrier gas, hydrogen reaction product and aluminum chloride reaction product are gaseous. Any silicon chloride reaction product which might form is also gaseous.

What is claimed is:

1. A process for growing crystals, having a breadth of at least 500 microns, from a crystallizable inorganic compound which comprises forming a solution of the compound in a liquid solvent for the compound, forming a film of the solution and etching the solvent from the film with an etching gas which reacts with the solution to preferentially etch the solvent from the solution until crystals of said compound, having a breadth of at least 500 microns form; said solution, at etching pressure, having a solidification temperature lower than the melting or sublimation temperature of the compound and higher than the condensation temperatures of the etching gas and of reaction products formed by the etching, said etching temperature being between the solidification temperature of the solution and the melting or sublimation temperature of the compound, lower than the vaporization temperatures of the solvent and solution and higher than the condensation temperatures of the etching gas and reaction products and the etching time being between 1 minute and 1 hour.

2. The process of claim 1 wherein the etching gas has a condensation temperature below the solidification temperature of the solution.

3. The process of claim 2 wherein the solvent is etched by said etching as at a rate which is at least twice the rate that said material is etched by said gas.

4. The process of claim 3 wherein etching is continued until only crystals of essentially pure material remain.

5. The process of claim 3 wherein the material is silicon.

6. The process of claim 3 wherein the solution is formed at a temperature below 1350° C.

7. The process of claim 4 wherein the material is silicon and the solution is formed at a temperature below 1350° C.

8. The process of claim 7 wherein the solvent is aluminum and the solution is formed at a temperature between about 580° C. and about 1350° C.

9. The process of claim 8 wherein the etching gas is HCl and the etching temperature is between 580° C. and about 1350° C.

10. The process of claim 8 wherein the etching gas is HBr and the etching temperature is between 580° C. and about 1350° C.

11. The process of claim 7 wherein the solvent is calcium and the solution is formed between about 985° C. and about 1200° C.

12. The process of claim 11 wherein the etching gas is HBr and the etching temperature is between about 985° C. and about 1200° C.

13. The process of claim 7 wherein the solvent is germanium and the solution is formed between 940° C. and 1350° C.

14. The process of claim 13 wherein the etching gas is HCl and the etching temperature is between 940° C. and 1350° C.

15. The process of claim 13 wherein the etching gas is HF and the etching temperature is between 940° C. and 1350° C.

16. The process of claim 13 wherein the etching gas is HBr and the etching temperature is between 940° C. and 1200° C.

17. The process of claim 7 wherein the solvent is silver and the solution is formed at a temperature between about 835° C. and 1350° C.

18. The process of claim 17 wherein the etching gas is HF or $F_2$ and the etching temperature is between about 1160° C. to about 1350° C.

19. The process of claim 7 wherein the solvent is antimony and the solution is formed at a temperature between about 631° C. and about 1200° C.

20. The process of claim 19 wherein the etching gas is selected from the group consisting of HCl and $Cl_2$ and the etching temperature is between about 631° C. and about 1200° C.

21. The process of claim 7 wherein the solvent is copper and the solution is formed at a temperature between about 1085° C. and about 1350° C.

22. The process of claim 21 wherein the etching gas is selected from the group consisting of HF and $F_2$ and the etching temperature is between about 1085° C. and 1350° C.

23. The process of claim 7 wherein the solvent is manganese and the solution is formed at a temperature between 1150° C. and 1350° C.

24. The process of claim 23 wherein the etching gas is HCl and the etching temperature is between 1190° C. and 1350° C.

25. The process of claim 3 wherein the material is gallium arsenide, the solvent is gallium and the solution is formed at a temperature between 30° C. and about 1200° C.

26. The process of claim 25 wherein the etching gas is chlorine and the etching temperature is between 202° C. and 1200° C.

27. The process of claim 25 wherein the etching gas is bromine and the etching temperature is between 279° C. and 1200° C.

28. The process of claim 25 wherein the etching gas is fluorine and the etching temperature is between 800° C. and 1200° C.

29. The process of claim 28 wherein the etching temperature is about 1000° C.

30. The process of claim 25 wherein the etching gas is iodine and the etching temperature is between 345° C. and 1200° C.

31. The process of claim 3 wherein the material is indium phosphide, the solvent is indium and the solution is formed at a temperature between 157° C. and 1050° C.

32. The process of claim 31 wherein the etching gas is chlorine and the etching temperature is between 608° C. and 1050° C.

33. The process of claim 31 wherein the etching gas is bromine and the etching temperature is between 662° C. and 1050° C.

34. The process of claim 31 wherein the etching gas is iodine and the etching temperature is between 715° C. and 1050° C.

35. The process of claim 3 wherein the material is cadmium telluride, the solvent is tellurium and the solution is formed between 452° C. and 1000° C.

36. The process of claim 35 wherein the etching gas is chlorine and the etching temperature is between 452° C. and 1000° C.

37. The process of claim 36 wherein the etching gas is bromine and the etching temperature is between 452° C. and 1000° C.

38. The process of claim 3 wherein the material is mercury cadmium telluride, the solvent is mercury and the solution is formed between −38° C. and −1000° C.

39. The process of claim 38 wherein the etching gas is bromine and the etching temperature is between 345° C. and 1000° C.

40. The process of claim 38 wherein the etching gas is chlorine and the etching temperature is between 315° C. and 1000° C.

41. The process of claim 3 wherein the material is mercury cadium telluride, the solvent is tellurium, the solution is formed between 452° C. and 1000° C., the etching gas is chlorine and the etching temperature is between 452° C. and 1000° C.

42. The process of claim 3 wherein said etching occurs at a pressure less than one atmosphere.

43. The process of claim 42 wherein the material is silicon, the solvent is magnesium, the solution is formed at a temperature of from 950° C. to 1100° C., the etching gas is HCl and the etching temperature is about between 1000° C. and 1100° C. and the etching pressure is between about 0 and about 220 grams per square centimeter absolute.

44. The process of claim 1 wherein more than one material is dissolved in said solvent and crystals of the combined materials are formed.

* * * * *